United States Patent [19]
Lang et al.

[11] Patent Number: 6,046,073
[45] Date of Patent: Apr. 4, 2000

[54] PROCESS FOR PRODUCING VERY THIN SEMICONDUCTOR CHIPS

[75] Inventors: Günter Lang, Nürnberg; Werner Kröninger, Neutraubling, both of Germany

[73] Assignee: Siemens Aktiengesellschaft, Munich, Germany

[21] Appl. No.: 09/199,847

[22] Filed: Nov. 25, 1998

[30] Foreign Application Priority Data

Nov. 26, 1997 [DE] Germany .......................... 197 52 404

[51] Int. Cl.[7] ...................................... H01L 21/44
[52] U.S. Cl. ........................... 438/118; 438/119; 438/127
[58] Field of Search ..................... 438/118, 119, 438/127, 459

[56] References Cited

U.S. PATENT DOCUMENTS

| | | | |
|---|---|---|---|
| 5,273,940 | 12/1993 | Sanders . | |
| 5,496,764 | 3/1996 | Sun .......................................... | 438/459 |
| 5,645,707 | 7/1997 | Omoto ..................................... | 438/118 |
| 5,668,059 | 9/1997 | Christie et al. .......................... | 438/118 |
| 5,677,243 | 10/1997 | Maeta et al. ............................ | 438/118 |
| 5,786,242 | 7/1998 | Takemura et al. ...................... | 438/459 |
| 5,824,595 | 10/1998 | Igel et al. ................................ | 438/459 |

FOREIGN PATENT DOCUMENTS

| | | |
|---|---|---|
| 0729176A2 | 8/1996 | European Pat. Off. . |
| 63-24681 | 2/1988 | Japan . |

*Primary Examiner*—Kevin M. Picardat
*Attorney, Agent, or Firm*—Herbert L. Lerner; Laurence A. Greenberg; Werner H. Stemer

[57] ABSTRACT

The novel process facilitates the production of very thin semiconductor chips with thicknesses down to a few μm. The semiconductor chip is first of all arranged on contact surfaces, with the active side oriented toward the contact surfaces. The chip is then electrically connected to the contact surfaces via contact studs. Silicon is then removed from the exposed rear side of the semiconductor chip during a plasma etching process which has high selectivity with respect to the other materials.

9 Claims, 1 Drawing Sheet

PROCESS FOR PRODUCING VERY THIN SEMICONDUCTOR CHIPS

BACKGROUND OF THE INVENTION

1. Field of the Invention

The invention lies in the field of semiconductor manufacture. More particularly, the invention relates to a process for producing very thin semiconductor chips.

2. Description of the Related Art

U.S. Pat. No. 5,693,182 to Mathuni (European EP 0 729 176 A2) describes a process for producing large-scale integrated circuits on a semiconductor substrate. The substrate is a wafer which is ground thin before it is sawn up into individual chips. The damage zone on the rear side of the wafer caused by the grinding process is removed by etching. The backside of the wafer is etched prior to sawing with the front side of the wafer protected.

In the prior process, the complete wafer or silicon wafer from which the individual semiconductor chips are separated out is first of all ground thin and is then etched to the final thickness. For this purpose, the wafer is arranged with its front side (the "front side" is defined as the side carrying the circuits) on a mount substrate in order, on the one hand, to protect the circuits and, on the other hand, to provide a transport medium, since the thin wafers are very susceptible to fractures. The wafer is not separated into chips until after the etching process.

There is an increasing demand for thin semiconductor chips, since there is a demand for ever smaller installation heights. Particularly in so-called smart cards, the requirement is very strong, since the cards have a standardized thickness of only 0.8 mm, and the card manufacturers wish to make the cover of the cavity which holds the chip in the card thicker, so that it does not project visually in the card surface.

However, there is a problem with known thinning processes in that it is extremely difficult to process the thin chips any more, because they break very easily.

SUMMARY OF THE INVENTION

It is accordingly an object of the invention to provide a method of producing super-thin semiconductor chips, which overcomes the above-mentioned disadvantages of the heretofore-known devices and methods of this general type and which allows such semiconductor chips to be handled without any problems.

With the foregoing and other objects in view there is provided, in accordance with the invention, a method of producing a very thin semiconductor chip, which comprises the following steps:

placing a semiconductor chip on a contact surface with an active side of the semiconductor chip facing towards the contact surface, and electrically connecting the semiconductor chip with the contact surfaces;

plasma etching a back side of the semiconductor chip and removing silicon from an exposed back side of the semiconductor chip, wherein the plasma etching process is highly selective with respect to materials other than the silicon.

In accordance with an added feature of the invention, the edges of the semiconductor chip that are oriented toward the contact surface are protected with a protective covering prior to the plasma etching step.

In accordance with a further feature of the invention, the contact surfaces form a part of a leadframe.

In accordance with another feature of the invention, the contact surfaces are formed on a non-conductive mount film that defines a carrier element or mount element, the mount film has apertures formed therein and the semiconductor chip is connected through the apertures to the contact surfaces. According to the invention, thick chips, which may already have been, for example, mechanically thinned in advance, are first of all placed on the contact surfaces of a leadframe or of a carrier element which is in normal use in smart card assembly. The chips are in this case fitted using flip-chip technology, that is to say with the active side (the first side) oriented toward the contact surfaces. This avoids the electrical connection of the chips to the contact surfaces by means of bonding wires. The installation height is thus further reduced.

The semiconductor chips thus fitted are then subjected to a plasma etching treatment. The only lower limit on the minimum thickness is the thickness required for the functional capability. In principle, thicknesses of only a few μm are feasible. Since the individual chips are already fitted to a mount substrate, the thinness does not result in any problems in further handling.

In accordance with an additional feature of the invention, the leadframe or the carrier element is disposed on strip wound on a spool and carrying a multiplicity of leadframes or carrier elements. The individual process steps can thus be carried out using the so-called wheel-to-wheel process, that is to say the individual leadframes/carrier elements and semiconductor chips are passed through the individual process stations in the strip.

In accordance with a concomitant feature of the invention, a protective covering is placed on the semiconductor chip subsequently to the step of removing silicon, i.e., on the thinned chips. However, the protective coating can also be dispensed with, particularly if the leadframe or the carrier element is directly covered by the card.

Other features which are considered as characteristic for the invention are set forth in the appended claims.

Although the invention is illustrated and described herein as embodied in a process for producing very thin semiconductor chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
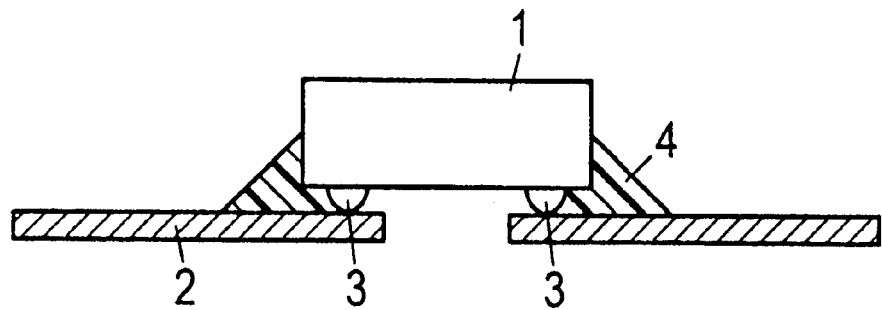
FIG. 1 is a partly sectional side view of an unthinned or previously thinned chip on leadframe contact surfaces.

Referring now to the figures of the drawing in detail and first, particularly, to FIG. 1 thereof, there is seen an unthinned or previously thinned semiconductor chip 1. The chip 1 has been cut out from a wafer and it is arranged on contact surfaces 2 of a leadframe (on a carrier element in FIG. 3). An active side is oriented toward the contact surfaces. In this case, the semiconductor chip 1 has raised contact studs 3 in order to produce an electrical contact to the contact surfaces 2. The electrical connection is at the same time used as a mechanical joint and is produced, for example, by soldering, ultrasound welding or bonding using a conductive adhesive. The edges of the semiconductor chip 1 facing the contact surfaces can be provided with a protective coating 4, in order to provide them with particular protection.

If the projection beyond the active region of the chip is adequate, the edge of the chip may also be etched. This improves the resistance to fracturing since the damage caused, inter alia during sawing, is etched away or at least rounded.

During the installation step as well as during the subsequent etching step, the contact surfaces of the leadframe are part of a conductor frame, which connects them, in a long strip which can be wound on a spool. In this way, all the process steps can be carried out as a continuous process using the so-called wheel-to-wheel principle, thus allowing simple handling.

Figure 3:
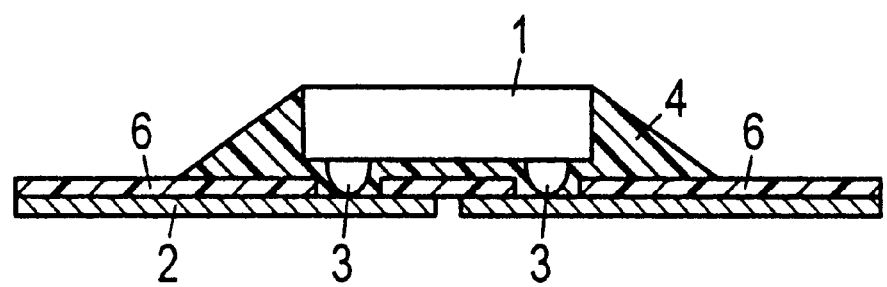
FIG. 3 is a similar view of a thinned chip on a carrier element.

In the case of a carrier element according to FIG. 3, the contact surfaces 2 are laminated onto a non-conductive mount substrate. The mount substrate 6 has apertures through which a connection is produced between the contact surfaces 2 and the contact studs 3 of the chip 1. The rear side of the semiconductor chip 1 in FIG. 3 has been etched away down to the edge of the protective coating 4.

Figure 2:
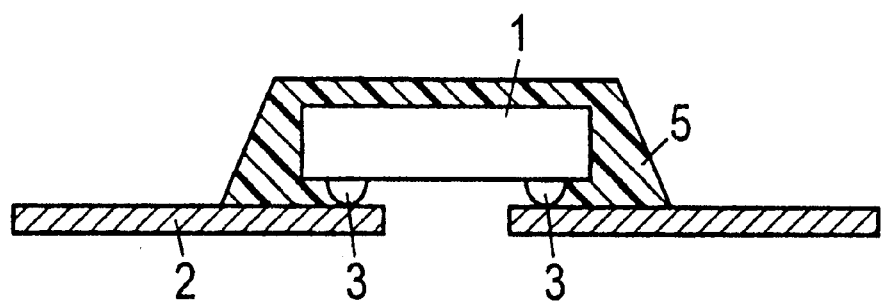
FIG. 2 is a similar side view of a thinned chip on leadframe contact surfaces.

FIG. 2 shows a thinned chip 1 on leadframe contact surfaces, which has finally been provided with a protective coating 5 that also covers the rear side of the chip 1.

The plasma etching of the chip 1 that has already been fitted on contact surfaces 2 can be carried out, for example, using a wafer-thinning etcher, SLIM XPL-900 available from the company Secon, Vienna, Austria. Chip thicknesses down to a few $\mu$m are feasible.

The method according to the invention, in which the separated semiconductor chip is first of all fitted and thinning by etching the rear side is carried out only after this, provides a simple and cost-effective solution to the problem of the difficulty in handling the separation of wafers that have been etched on the rear side. The process according to the invention can be used not only for chips for smart cards, but also for all semiconductor chips.

We claim:

1. A method of producing a very thin semiconductor chip, which comprises the following steps:
   placing a semiconductor chip on a contact surface with an active side of the semiconductor chip facing towards the contact surface, and electrically connecting the semiconductor chip with the contact surface; and
   plasma etching a back side of the semiconductor chip to remove silicon from an exposed back side of the semiconductor chip, wherein the plasma etching process is highly selective with respect to materials other than the silicon.

2. The method according to claim 1, which further comprises, prior to the plasma etching step, protecting edges of the semiconductor chip oriented toward the contact surface with a protective covering.

3. The method according to claim 1, which further comprises applying a protective covering on the semiconductor chip subsequently to the step of removing silicon.

4. The method according to claim 1, which comprises a leadframe, the contact surface forming a part of the leadframe.

5. The method according to claim 4, wherein the leadframe is a part of a strip wound on a spool and having a multiplicity of leadframes.

6. The method according to claim 1, which comprises a non-conductive mount film formed with the contact surfaces, the non-conductive mount film having apertures formed therein and forming a carrier element, and wherein the semiconductor chip is connected through the apertures to the contact surfaces.

7. The method according to claim 6, wherein the carrier element is a part of a strip wound on a spool and having a multiplicity of carrier elements.

8. A method of producing a very thin semiconductor chip, which comprises the following steps:
   placing a semiconductor chip on a contact surface with an active side of the semiconductor chip facing towards the contact surface, and electrically connecting the semiconductor chip with the contact surface; and
   next, plasma etching a back side of the semiconductor chip to remove silicon from an exposed back side of the semiconductor chip, wherein the plasma etching process is highly selective with respect to materials other than the silicon.

9. A method of producing a very thin semiconductor chip, which comprises the following steps:
   placing a semiconductor chip on a contact surface with an active side of the semiconductor chip facing towards the contact surface, and electrically connecting the semiconductor chip with the contact surface; and
   removing silicon from an exposed back side of the semiconductor chip by plasma etching a back side of the semiconductor chip, wherein the silicon removal step does not include a gross polishing step to remove silicon, and the plasma etching process is highly selective with respect to materials other than the silicon.

* * * * *